United States Patent
Ono

(10) Patent No.: US 7,626,876 B2
(45) Date of Patent: Dec. 1, 2009

(54) SEMICONDUCTOR MEMORY DEVICE AND ITS TEST METHOD

(75) Inventor: Yukichi Ono, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/288,671

(22) Filed: Oct. 22, 2008

(65) Prior Publication Data

US 2009/0059699 A1    Mar. 5, 2009

Related U.S. Application Data

(62) Division of application No. 11/527,003, filed on Sep. 26, 2006, now Pat. No. 7,450,449.

(30) Foreign Application Priority Data

Sep. 29, 2005    (JP) .............................. 2005-284744

(51) Int. Cl.
*G11C 29/00* (2006.01)
(52) U.S. Cl. ................... 365/201; 365/189.08; 365/241
(58) Field of Classification Search ................ 365/201, 365/189.08, 241, 222, 189.07, 185.13, 191, 365/233.5, 230.06
See application file for complete search history.

(56) References Cited

U.S. PATENT DOCUMENTS

| | | | |
|---|---|---|---|
| 6,166,979 A * | 12/2000 | Miyamoto | ................. 365/219 |
| 6,181,640 B1 | 1/2001 | Kang | |
| 6,515,922 B1 | 2/2003 | Yamagata | |
| 2003/0103395 A1 * | 6/2003 | Ooishi | ........................ 365/201 |
| 2005/0063238 A1 | 3/2005 | Nambu et al. | |

FOREIGN PATENT DOCUMENTS

| | | |
|---|---|---|
| JP | 4344399 | 11/1992 |
| JP | 11066889 | 3/1999 |
| JP | 2001023400 | 1/2001 |
| JP | 2001210095 | 8/2001 |

* cited by examiner

*Primary Examiner*—Dang T Nguyen
(74) *Attorney, Agent, or Firm*—Pillsbury Winthrop Shaw Pittman LLP

(57) ABSTRACT

A test circuit is connected to a memory core integrated unit of SRAM. When the memory core integrated unit is to be tested, a test start signal is set to a high level so that one of a bit line and an inverted bit line is used for data write and the test circuit sets data to this selected bit line. The other bit line is used for data read, and the written data is set to this bit line in the normal operation. Whether each memory core is not defective is judged by EOR which confirms data set to the bit line and data set to the inverted bit line are mutually inverted each other. A test method is realized which can test a defect of each memory core of a semiconductor memory such as SRAM in a short time.

9 Claims, 7 Drawing Sheets

SEMICONDUCTOR MEMORY DEVICE AND ITS TEST METHOD

CROSS REFERENCE TO RELATED APPLICATION

This application is a divisional of U.S. patent application Ser. No. 11/527,003, filed Sep. 26, 2006 now U.S. Pat. No. 7,450,449, which in turn claims priority on Japanese Patent Application No. 2005-284744 filed on Sep. 29, 2005, the entire contents of which are incorporated herein by reference.

BACKGROUND OF THE INVENTION

A) Field of the Invention

The present invention relates to a semiconductor memory device such as a static random access memory (SRAM) and its test method.

B) Description of the Related Art

A read/write test for memory cores is performed before semiconductor memories such as SRAM are shipped, the memory cores storing binary data of "0" and "1".

This read/write test for a memory core generates first a test pattern to decide what data is written in which memory core. Next, a write mode is set and an address of a subject memory core is designated. As the address is designated, a corresponding word line and corresponding bit line and inverted bit line are selected, and data determined by the test pattern is written in the designated memory core.

After the data write, a mode is changed to a read mode, the address of the memory core in which data was written is designated, and the data is read. If the write data is coincident with the read data, it is judged that the memory core can be read/written correctly, whereas if not coincident, it is judged that the memory core is defective. For conventional reference documents regarding this application, refer to Japanese Patent No. 3348632, JP-A-HEI-04-344399, JP-A-2001-023400 and JP-A-2001-210095.

Memory cores occupy most of the size of SRAM, and most of defects are formed in the memory cores. Therefore, the test method is desired being capable of inspecting defects of memory cores in a short time. However, a conventional read/write test is required to activate peripheral circuits for memory cores while memory cores are inspected, in order to execute the above-described series of read/write operations.

This series of operations takes a time of several clocks of the operation frequency of SRAM. If memory cores of SRAM are implemented in LSI particularly at a deep logical stage, the number of peripheral circuits to be activated during the test increases, and the test pattern is required to be generated while considering the timings of operating the peripheral circuits. It takes therefore a long time to form a test pattern.

SUMMARY OF THE INVENTION

An object of this invention is to provide a semiconductor memory device such as SRAM capable of inspecting memory cores of the memory in a short time and its test method.

According to one aspect of the present invention, there is provided a test method for a memory device comprising steps of:

(a) preparing a memory device comprising: a plurality of memory elements disposed in columns; word lines to which a select signal is applied to allow data to be input and output to and from a predetermined one of the plurality of memory elements; and bit lines and inverted bit lines connected to the plurality of memory elements and input with signals having mutually inverted logical levels when data is to be written to the memory element selected by the select signal;

(b) selecting a memory element;

(c) inputting an input signal for test to said bit line of the memory element selected at the step (b), outputting an output signal corresponding to the test input signal from the inverted bit line, and detecting whether the input and output signals correspond to data having mutually inverted logical levels;

(d) repeating the steps (b) and (c) by changing the memory element to be selected by the step (b) to select all of the plurality of memory elements;

(e) after the step (d), selecting a memory element;

(f) inputting an input signal for test to said inverted bit line of the memory element selected at the step (e), outputting an output signal corresponding to the test input signal from the bit line, and detecting whether the input and output signals correspond to data having mutually inverted logical levels;

(g) repeating the steps (e) and (f) by changing the memory element to be selected by the step (e) to select all of said plurality of memory elements;

DESCRIPTION OF THE PREFERRED EMBODIMENTS

Figure 1:
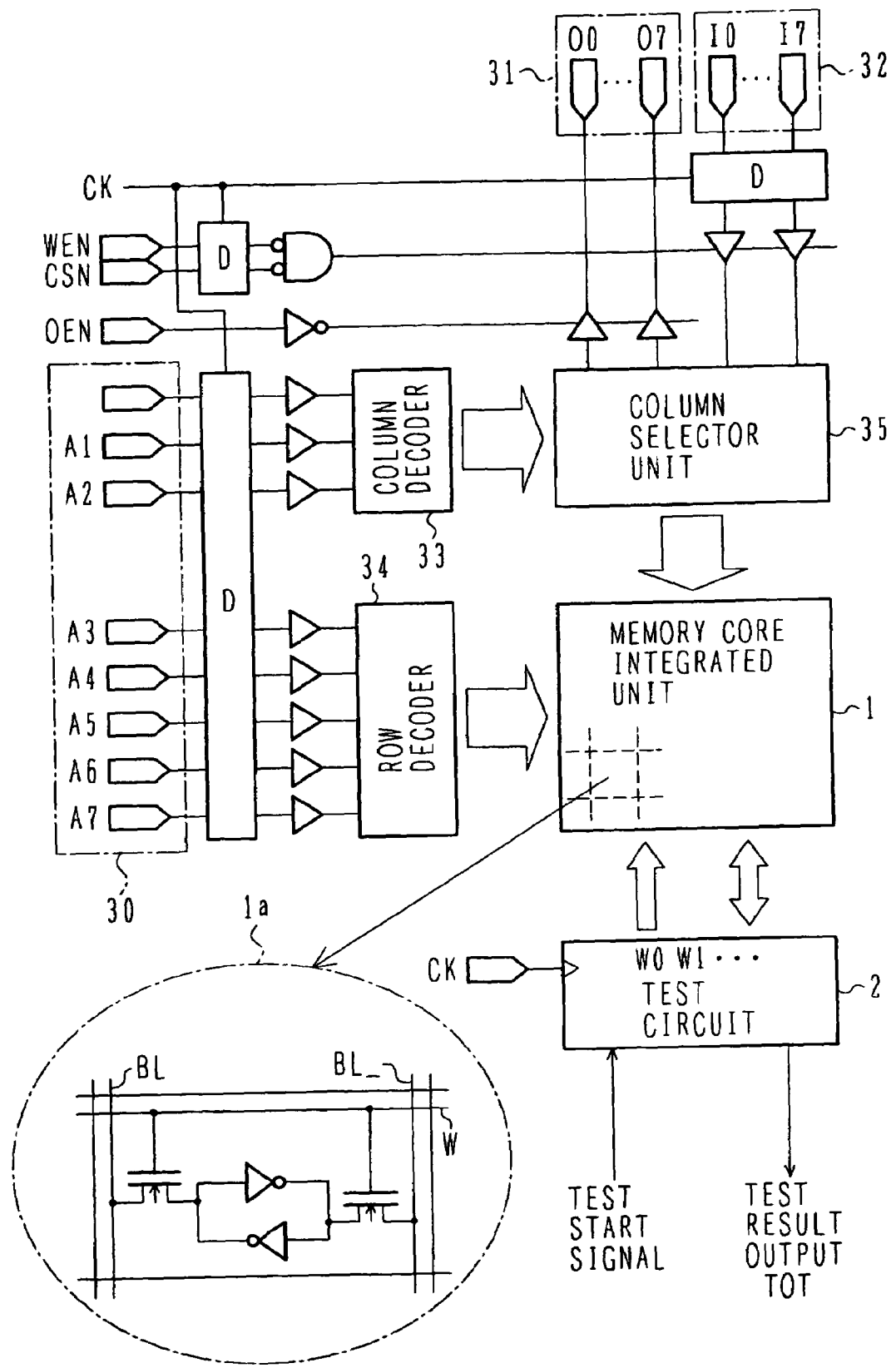
FIG. 1 is a block diagram showing the structure of SRAM according to an embodiment of the present invention.

Embodiments of the present invention will be described with reference to the accompanying drawings. FIG. 1 is a block diagram showing the structure of a static random access memory (SRAM) according to an embodiment of the present invention. In FIG. 1, a memory core integrated unit 1 integrates a number of memory cores each storing one bit. A memory core of one bit is shown in an enclosure 1a. A test circuit 2 is used for testing SRAM.

An address signal bus 30 is used for designating an address of each memory core in the memory core integrated unit 1. An output data bus 31 is used for outputting data stored in each memory core in the memory core integrated unit 1. An input data bus 32 is used for inputting data to be written in each memory core in the memory core integrated unit 1. A column decoder 33 decodes lower three bits of address data input from the address signal bus. A row decoder 34 decodes upper five bits of the address data input from the address signal bus 30.

A column selector unit 35 is used for selecting a column in accordance with a value decoded by the column decoder 33 and writing data input from the input bus 32 into memory cores in the selected column. The column selector unit 35 is also used for selecting a column in accordance with a value decoded by the column decoder 33 and outputting data stored in memory cores in the selected column to the output bus 31.

The address data from the address signal bus 30, the inputting data from the input data bus 32, a write enable signal (WEN signal), and a chip select signal (CSN) are supplied via D-type flip-flops D respectively. Clock signal CK is provided to those D-type flip-flops D.

Figure 2:
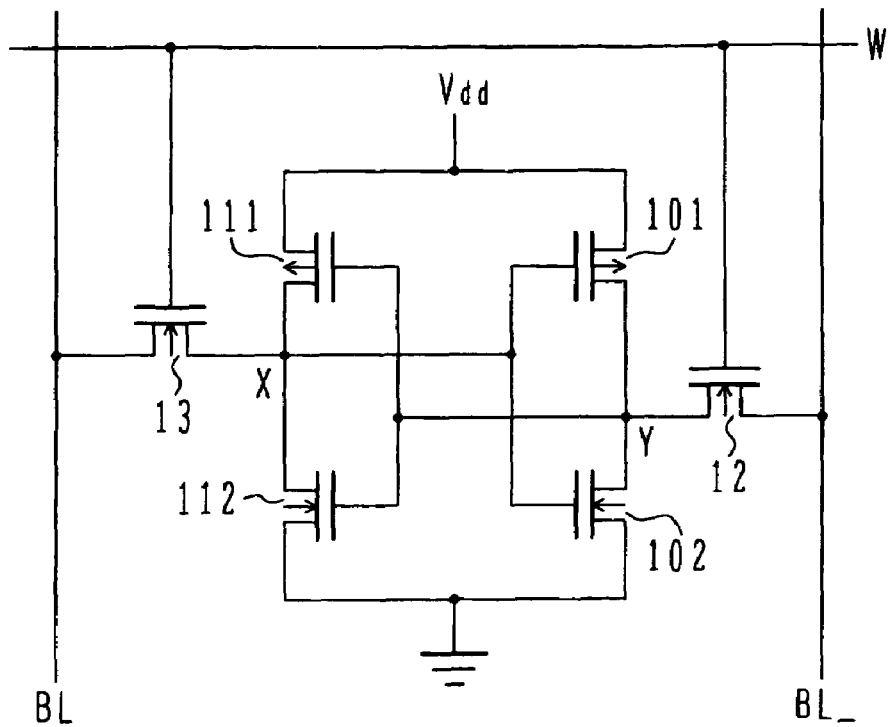
FIG. 2 is a block diagram showing the structure of a memory core of one bit.

FIG. 2 is a block diagram showing the structure of a memory core of one bit. Metal oxide semiconductor field effect transistors (MOSFETs) 12 and 13 are used for switching between a read operation and a write operation relative to the memory core. MOSFETs 101, 102, 111 and 112 are used for storing data of one bit.

MOSFETs 101 and 102 constitute a NOT circuit, and MOSFETs 111 and 112 constitute another NOT circuit. The memory core can therefore be simplified to the circuit shown in FIG. 3.

A double bit line, i.e., a bit line BL and an inverted bit line BL_ are selected by column data to read/write data. A word line W is selected by row data and turns on/off MOSFETs 12 and 13. Each memory core of one bit is selected by the bit line BL, inverted bit line BL_ and word line W.

Figure 3:
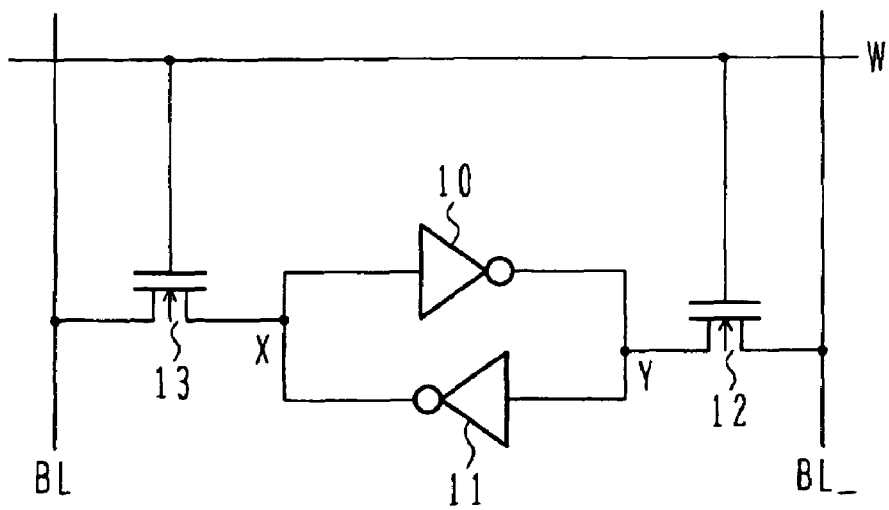
FIG. 3 is a block diagram showing a simplified structure of a memory core of one bit.

The operation of this embodiment will be described with reference to FIGS. 1 to 3. First, description will be made on a write operation of SRAM. Input to SRAM for the write operation are: address data indicating an address of a memory core in which data is to be written; data to be written; a write enable signal (WEN signal) for enabling the write operation; and a chip select signal (CSN) for designating SRAM in which data is to be written.

Address data is represented by row data of upper five bits and column data of lower three bits. The column data is decoded by the column decoder 33 and output to the column selector unit 35, whereas row data is decoded by the row decoder 34 and output to the memory core integrated unit 1.

Data to be written has eight bits and output to the column selector unit 35 when the WEN and CSN signals take a low level. The column selector unit 35 selects the double bit line, i.e., the bit line BL and inverted bit line BL_ in accordance with the column data supplied from the column decoder 33, and sets the input data to be written to the double bit line.

Data having mutually inverted logical levels is set to the bit line BL and inverted bit line BL_. For example, when "1" is to be written in a memory core, a high level signal is set to the bit line BL and a low level signal is set to the inverted bit line BL_. Conversely, when "0" is to be written in a memory core, a low level signal is set to the bit line BL and a high level signal is set to the inverted bit line BL_.

In the memory core integrated unit 1, the word line designated by the input row data takes a high level, to turn on MOSFETs 12 and 13 shown in FIG. 2 and connected to the selected word line. Then, the data set to the bit line BL and inverted bit line BL_ is output to X and Y points.

For example, assuming that a high level is set to the bit line BL and a low level is set to the inverted bit line BL_, MOSFETs 111 and 102 turn on and MOSFETs 112 and 101 turn off, so that a high level is retained at X point and a low level is retained at Y point. After the write operation is completed, the word line changes from the high level to the low level, and MOSFETs 12 and 13 turn off.

Next, description will be made on a read operation of SRAM. Input to SRAM for the read operation are: address data indicating an address of a memory core from which data is to be read; and an output enable signal (OEN signal) for enabling the read operation. Similar to the write operation, in the read operation, the bit line BL, inverted bit line BL_ and word line W are selected in the memory core integrated unit 1 in accordance with the address data, and the designated word line W takes the high level.

As the designated word line W takes the high level, MOSFETs 12 and 13 shown in FIG. 2 turn on, and data set to X and Y points is output to the bit line BL and inverted bit line BL_.

For example, assuming that a high level is set to X point and a low level is set to Y point, after the word line W takes the high level, the bit line BL takes the high level and the inverted bit line BL_ takes the low level. The column selector unit 35 reads the data set to the bit line BL and inverted bit line BL_, and outputs the read data to the output data bus 31 while the OEN signal takes the low level.

The read/write operation of SRAM in a normal operation state has been described in detail. Next, with reference to FIGS. 4 to 7, a test procedure of SRAM will be described. In test of SRAM, a test start signal of a high level is input from an external apparatus to the test circuit 2.

Figure 4:
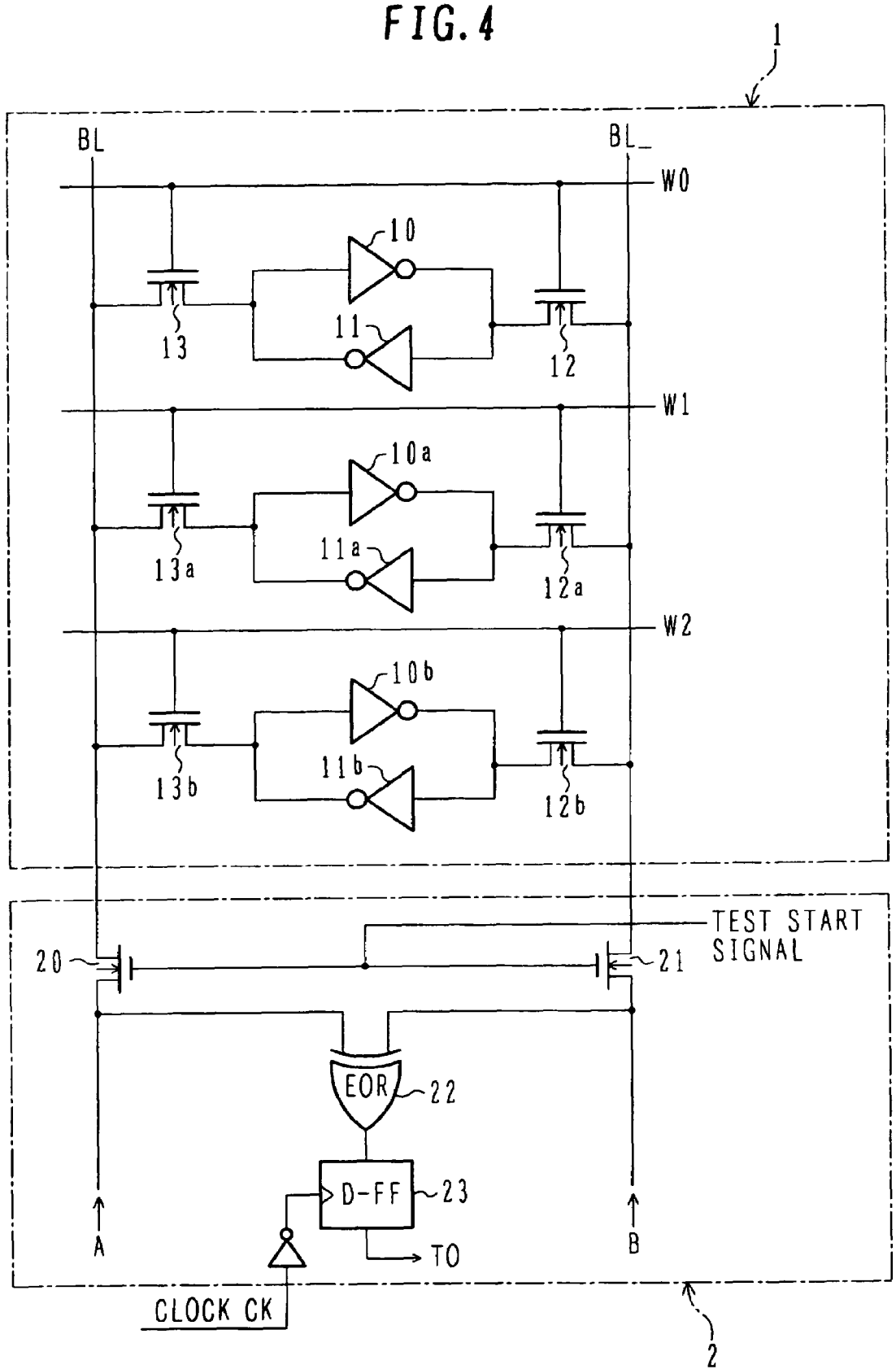
FIG. 4 is a diagram showing the structure of a memory core integrated unit 1 and a test circuit 2 shown in FIG. 1.

As the test start signal takes the high level, MOSFETs 20 and 21 shown in FIG. 4 turn on and a test input signal is input from the test circuit 2 to the bit line BL or inverted bit line BL_ of the memory core integrated unit 1.□@□@A portion of test circuit 2 is shown in FIG. 4.

At the same time, a connection between the memory core integrated unit 1 and column selector unit 35 is disconnected, so that the read/write operation via the column selector unit 35 is inhibited. In selecting an address (word line W) of a memory core for test write by the test circuit, the address may be input externally from the address signal bus 30 via the row decoder 34 or the address may be selected by using a circuit shown in FIG. 5 to be described later. In the following, a test will be described by selecting a word line by using the circuit shown in FIG. 5.

Figure 5:
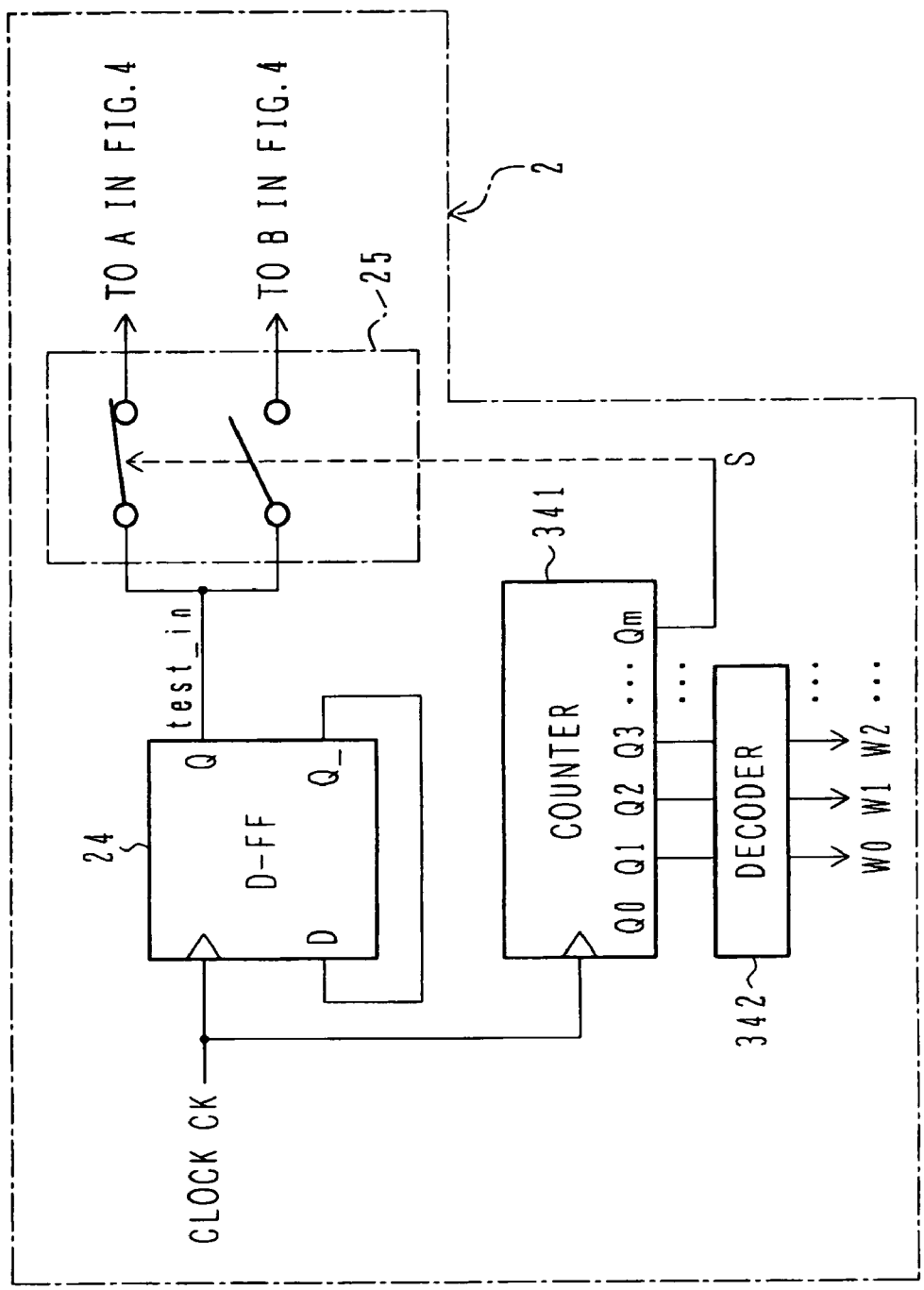
FIG. 5 is a circuit diagram of an output signal generator circuit for supplying a signal to a bit line BL and an inverted bit line BL_ shown in FIG. 4.

With reference to the circuit shown in FIG. 5, description will be made on a procedure of generating a test input signal (test_in) to be input from the test circuit 2 to the bit line BL or inverted bit line BL_. Another portion of test circuit 2 is shown in FIG. 5. In the test circuit 2 shown in FIG. 5, a clock CK to be used for SRAM is frequency-divided by ½ by a delayed flip-flop (D-FF) 24 to form the test input signal test_in. The test input signal test_in is selectively input to A point or B point shown in FIG. 4 through a switch circuit 25

A clock signal CK is also input to a counter 341, and the most significant bit Q1 of the counter 341 is output to the switch circuit 25. The second bit Q1 to the bit one bit before the most significant bit are output to the decoder 342. The number of output bits of the counter is determined by the number of word lines W in the memory core integrated circuit 1.

The decoder 342 decodes data output from the counter 341 and outputs decoded data to each of the word lines W0, W1, . . . of the memory core integrated unit 1 (word line designation circuit). The decoder 342 outputs the decoded data in such a manner that W0 takes a high level and the other word lines take a low level while the counter 341 outputs "2" (counts the clock twice) and "3" (counts the clock three times) and that W1 takes a high level and the other word lines take a low level while the counter 341 outputs "4" (counts the clock four times) and "5" (counts the clock five times). In this manner, as the output of the counter 341 is incremented by "2", the word line taking the high level transits one line after another.

Figure 6:
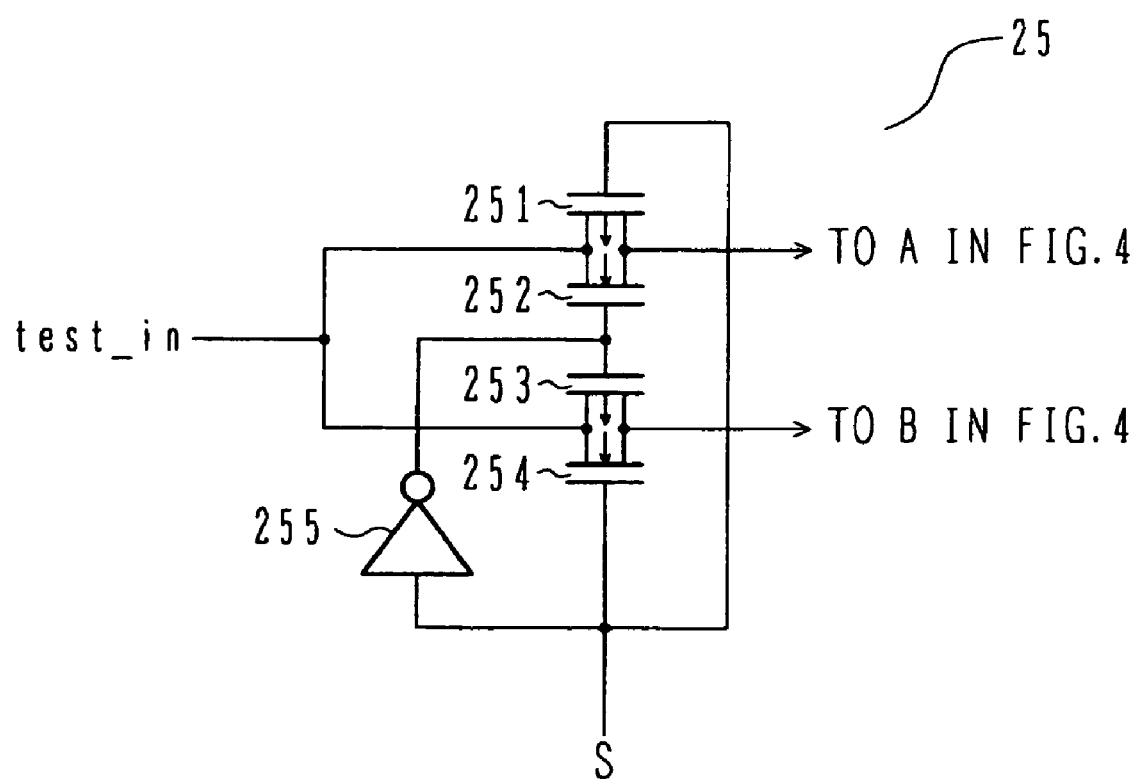
FIG. 6 is a circuit diagram showing the structure of a switch circuit 25 shown in FIG. 5.

FIG. 6 is a diagram showing the structure of the switch circuit 25 shown in FIG. 5. When the output Qm of the counter 341 takes the low level, MOSFETs 251 and 252 turn on and MOSFETs 253 and 254 turn off, so that the test input signal test_in is output to A point of FIG. 4 (i.e., bit line BL).

When the output Qm of the counter 341 takes the high level, MOSFETs 251 and 252 turn off and MOSFETs 253 and 254 turn on, so that the test input signal test_in is output to B point of FIG. 4 (i.e., inverted bit line BL).

Figure 7:
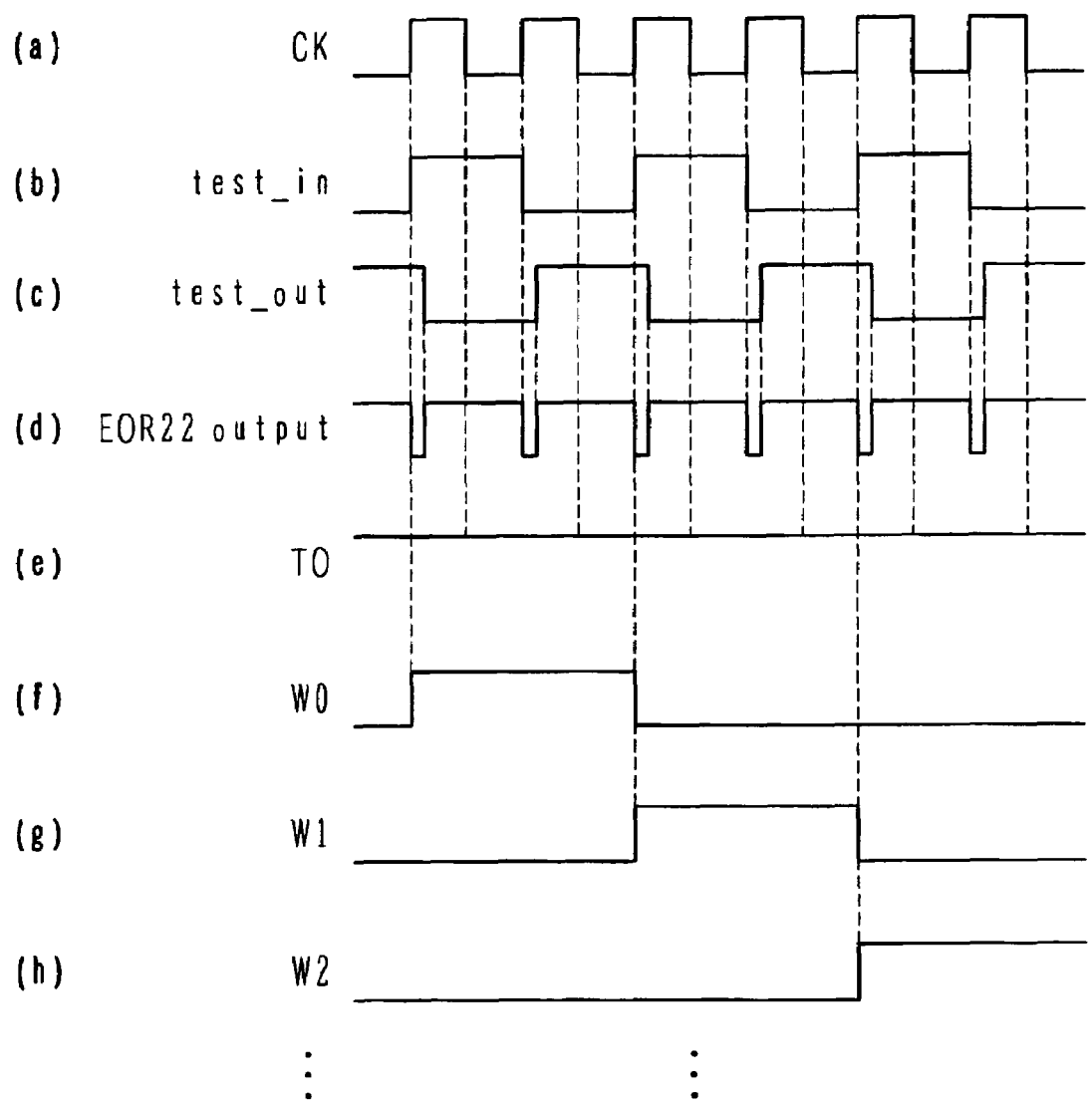
FIG. 7 is a timing chart showing signals in SRAM.

FIG. 7 is a timing chart illustrating signals in SRAM. The clock CK is shown at (a) in FIG. 7, and the test input signal test_in generated by frequency-dividing the clock CK by ½ at D-FF 24 is shown at (b) in FIG. 7. The test input signal test_in is output via the switch circuit 25 to the bit line BL or inverted bit line BL_.

When the test input signal test_in is output to the bit line BL via MOSFET 20 (S takes a low level), the test input signal test_in is output to the memory core connected to the word line taking the high level in response to the output from the decoder 342 shown in FIG. 5.

While the output of the counter 341 shown in FIG. 5 takes a value "2" to "3" (only Q1 takes the high level), the word line W0 takes the high level, i.e., MOSFETs 12 and 13 shown in FIG. 4 turn on. Since Qm(S) takes the low level, the test input signal test_in is output to A point shown in FIG. 4. The logic of the test input signal test_in is inverted by the NOT circuit 10 and output to the inverted bit line BL_. An output signal test_out at the bit line BL_ is shown at (c) in FIG. 7. In this case, the bit line BL is used for data write, and the inverted bit line BL_ is used for data read.

The test input signal test_in (in this case, A point in FIG. 4) and the test output signal test_out (in this case, B point in FIG. 4) are input to two input terminals of an exclusive OR (EOR, exclusive logical sum calculation) circuit 22 in the test circuit 2 shown in FIG. 4. An output of the EOR circuit 22 is shown at (d) in FIG. 7. An output of the EOR circuit 22 is detected by D-FF 23 at a rise of an inverted clock CK_ (i.e., a fall of the clock CK). An output of D-FF 23 (TO) takes the high level as shown at (e) in FIG. 7.

If the memory core is defective and the test output signal test_out is not a signal having an inverted logic of the test input signal test_in, an output TO of D-FF 23 takes the low level. In this manner, a defect can be detected. While the output of the counter 341 takes a value "4" to "5", the word line W1 takes the high level, so that the next memory core can be tested. The test continues as the counter 341 counts up.

As shown in FIG. 7, in the write operation test, the test input signal test_in of a high level is written from the bit line BL in a memory core at the word line W0 during a first cycle of the clock CK, the test input signal test_in of a low level is written from the bit line BL in a memory core at the word line W0 during a second cycle of the clock CK, and the write operation test is performed for all word lines W during two cycles of the clock CK.

After the test for all word lines is completed, the most significant bit Qm of the counter 341 shown in FIG. 5 takes the high level. Thereafter, the test input signal test_in is output from B point shown in FIG. 4 to the inverted bit line BL_. The test output signal test-out is output to point A shown in FIG. 4. Similar to the test of inputting via the bit line BL, the write operation test is performed for all word lines W during two cycles of the clock CK. As the input test via the inverted bit line BL_ is completed for all word lines W, the test of the column of memory cores connected to the bit line BL and inverted bit line BL_ is completed. If an output of D-FF 23 TO takes always the high level, it is judged that memory cores in this row are normal.

Figure 8:
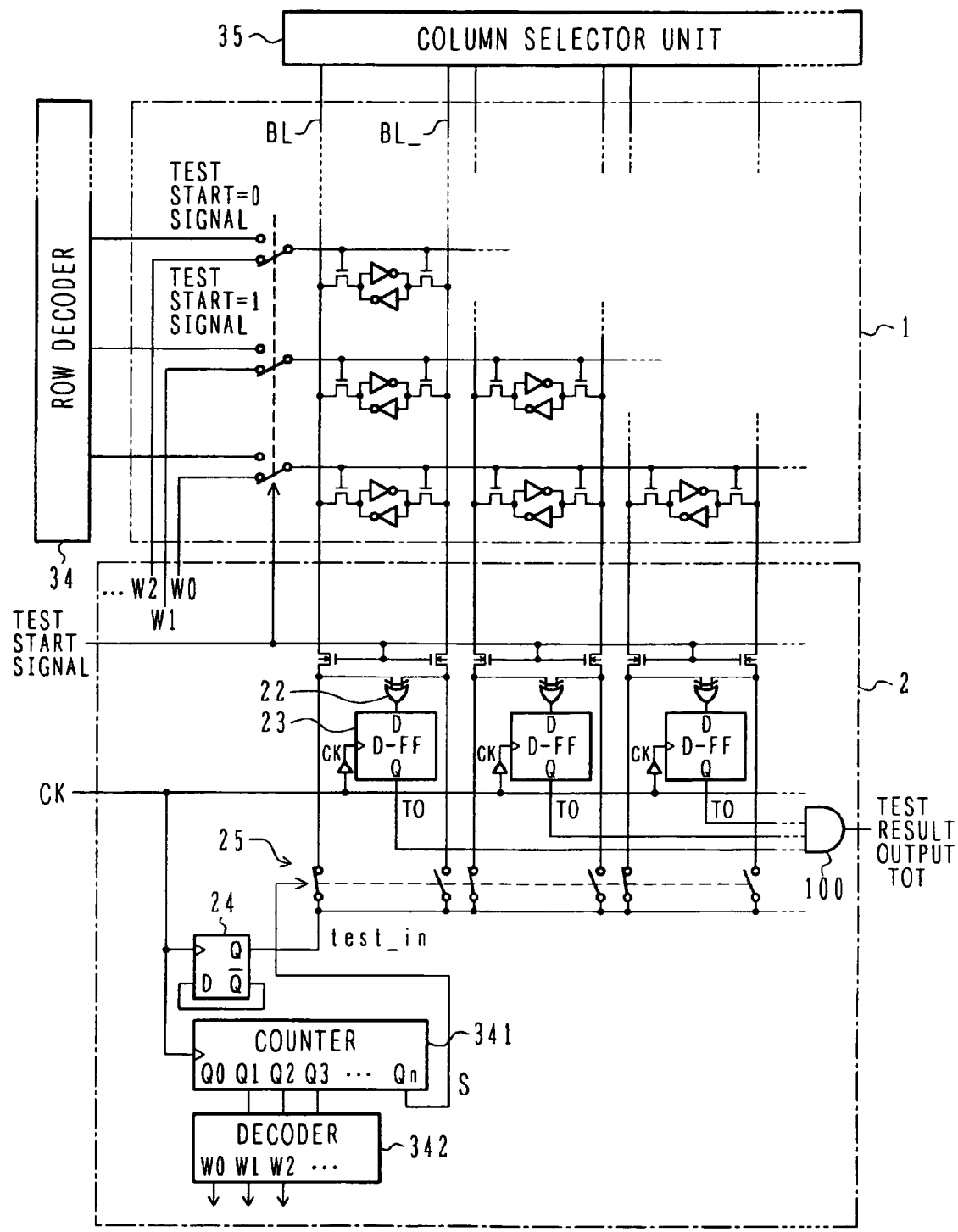
FIG. 8 is a circuit diagram of the memory core integrated unit 1 and the test circuit 2.

A test method for one column of memory cores has been described. The other columns of memory cores can be tested in a similar fashion. FIG. 8 is a circuit diagram of the memory core integrated unit 1 and the test circuit 2. The memory core integrated unit 1 includes numbers of columns of memory cores.

The test input signal test_in generated by D-FF 24 of the test circuit 2 shown in FIG. 5 is provided to each column of memory cores in parallel. Switches for switching the test input signal between bit line BL and inverted bit line BL_ (switch circuit 25 shown in FIG. 5) and circuits for detecting test result (EOR 22, D-FF 23 shown in FIG. 4) are provided for each column of memory cores.

Switches for connecting the test circuit 2 to the memory core integrated unit 1 by test start signal (MOSFET 20 and 21 shown in FIG. 4) are also provided for each column of memory cores. A switch circuit for disconnecting the column selector unit 35 from the memory core integrated unit 1 by test start signal is included in the column selector unit 35. Switches for switching supply source of word line selection signal between row decoder 34 and decoder 342 of the test circuit 2 are provided in the memory core integrated unit 1.

Test results TO from each column of memory cores are provided to an AND circuit 100. AND circuit 100 execute AND operation on all test results TO to generate a test result output TOT for all columns of memory cores. If the test result output TOT takes always the high level, it is judged that SRAM is normal. If the test result output TOT takes the low level at least once, it is judged that SRAM is not normal.

The circuit structure is not limited to this embodiment. Changes of design within the scope of this invention can also be done. For example, AND circuit 100 for generating a combined result output TOT may be omitted. Test results TO from each column of memory cores may be output respectively.

According to the embodiment, the read and write test of data of both the high and low levels is performed for all memory core cells without operating the peripheral circuits such as the column selector circuit 35. The test signals used for test is automatically generated from the clock, and the tester is not required to prepare the test signals. Further, data read for one memory core is completed in one clock, and data write for one memory core is completed in one clock. The test can therefore be completed in a short time.

The present invention has been described in connection with the preferred embodiments. The invention is not limited only to the above embodiments. It will be apparent to those skilled in the art that other various modifications, improvements, combinations, and the like can be made without departing from the gist of the present invention. For example, in selecting a word line during the test, the address signal bus 30 shown in FIG. 1 may be used without using the decoder 342 shown in FIG. 5.

The present invention is suitable for use with semiconductor memories such as SRAM.

According to the test method of the embodiment for SRAM memory cores, data is directly written and read relative to the bit lines of a memory core. It is therefore unnecessary to operate peripheral circuits. A read operation of data from a memory core and a write operation of data into a memory core each can be executed in a time corresponding to one clock of the operation frequency of SRAM. The time taken to test can therefore be shortened.

I claim:

1. A test method for a memory device comprising steps of:
   (a) preparing a memory device including: a plurality of memory elements disposed in columns; word lines to which a select signal is applied to allow data to be input to and output from a predetermined one of said plurality of memory elements; and bit lines and inverted bit lines connected to said plurality of memory elements and input with signals having mutually inverted logic levels when data is to be written to the memory element selected by said select signal;

(b) selecting a memory element;

(c) inputting an input signal for test to said bit line of the memory element selected at said step (b), outputting an output signal corresponding to said test input signal from said inverted bit line, and detecting whether said input and output signals correspond to data having mutually inverted logic levels;

(d) repeating said steps (b) and (c) by changing the memory element to be selected by said step (b) to select all of said plurality of memory elements;

(e) after said step (d), selecting a memory element;

(f) inputting an input signal for test to said inverted bit line of the memory element selected at said step (e), outputting an output signal corresponding to said test input signal from said bit line, and detecting whether said input and output signals correspond to data having mutually inverted logic levels; and (g) repeating said steps (e) and (f) by changing the memory element to be selected by said step (e) to select all of said plurality of memory elements.

2. The test method for a memory device according to claim 1, wherein said step (c) includes a step of generating the input signal to be input to said bit line, from a clock signal.

3. The test method for a memory device according to claim 1, wherein said step (f) includes a step of generating the input signal to be input to said inverted bit line, from a clock signal.

4. The test method for a memory device according to claim 1, wherein said step (c) uses an exclusive logical sum calculation to detect whether said input and output signals correspond to data having mutually inverted logic levels.

5. The test method for a memory device according to claim 1, wherein said step (f) uses an exclusive logical sum calculation to detect whether said input and output signals correspond to data having mutually inverted logic levels.

6. The test method for a memory device according to claim 1, wherein said step (d) uses a counter for counting a clock signal to change the memory element to be selected at said step (b).

7. The test method for a memory device according to claim 1, wherein said step (g) uses a counter for counting a clock signal to change the memory element to be selected at said step (e).

8. The test method for a memory device according to claim 1, wherein said steps (c) and (f) each includes a step of generating the input signal from a clock signal, and said steps (d) and (g) each use a counter for counting said clock signal to change the memory element to be selected.

9. The test method for a memory device according to claim 1, wherein said memory device is a SRAM.

* * * * *